United States Patent

Brunner

[11] Patent Number: 5,410,449
[45] Date of Patent: Apr. 25, 1995

[54] HEATSINK CONDUCTOR SOLDER PAD

[75] Inventor: Kevin W. Brunner, Kokomo, Ind.

[73] Assignee: Delco Electronics Corp., Kokomo, Ind.

[21] Appl. No.: 261,320

[22] Filed: Jun. 16, 1994

Related U.S. Application Data

[63] Continuation of Ser. No. 65,383, May 24, 1993, abandoned.

[51] Int. Cl.⁶ .............................................. H05K 7/20
[52] U.S. Cl. .................................... 361/719; 174/252; 257/713; 361/705
[58] Field of Search ............... 165/80.3, 185; 174/252, 174/16.3, 260; 257/701, 705, 666, 706, 713, 775, 776; 361/704, 705, 707, 713, 718–720, 760, 764, 767, 768, 813, 722

[56] References Cited

U.S. PATENT DOCUMENTS

| | | | |
|---|---|---|---|
| 4,158,745 | 6/1979 | Keller | 361/813 |
| 4,449,165 | 5/1984 | Kaufman | 361/813 |
| 4,700,273 | 10/1987 | Kaufman | 361/813 |
| 5,088,007 | 2/1992 | Missele | 361/386 |
| 5,168,348 | 12/1992 | Chu | 257/713 |
| 5,258,887 | 11/1993 | Fortune | 361/720 |
| 5,287,001 | 2/1994 | Buchmann | 257/719 |

Primary Examiner—Gerald P. Tolin
Attorney, Agent, or Firm—Mark A. Navarre

[57] ABSTRACT

A method is provided for improving the integrity of a solder joint between a large surface-mounted integrated circuit component and a circuit board substrate. In particular, the strength of the solder joint is promoted by preventing the formation of voids in the solder joint during a reflow soldering process by which the component is secured to the circuit board. The method relies on the geometry of the conductor pad used to provide electrical contact between the component and the remaining circuitry and thermal contact between the component and the substrate. The conductor pad is composed of a number of platforms which are defined by a network of trenches that provides numerous passages through which the solder and flux gases may flow during the soldering process. The platforms serve as sites on which the solder compound can be selectively deposited in a manner that further enhances the soldering process, such that voids within the solder joint are substantially avoided.

5 Claims, 1 Drawing Sheet

HEATSINK CONDUCTOR SOLDER PAD

This is a continuation of application Ser. No. 08/065,383 filed on May 24, 1993, now abandoned.

The present invention generally relates to surface mounted components soldered to a conductor pad formed on a hybrid integrated circuit board. More particularly, this invention relates to a conductor pad which is configured to enhance the solderability of such a component to the conductor pad, by promoting and channeling the flow of solder and flux between the component and the conductor pad so as to avoid the formation of voids in the solder, whereby a strong solder joint is formed between the component and the conductor pad and enhanced thermal transfer characteristics are attained between the component and the conductor pad.

BACKGROUND OF THE INVENTION

Hybrid integrated circuits used in automotive applications often employ surface-mounted circuit components. Such components are typically soldered to the surface of a circuit board to make electrical contact to a conductor formed on the circuit board. These components are generally enclosed within a protective outer casing which includes a heatsink that is maintained in contact with the circuit board. Both electricity and heat are conducted between the circuit component and the conductor through this heatsink. To conduct heat away from the conductor, the circuit board will typically be formed from a ceramic material in that ceramic is generally a better thermal conductor than other conventional circuit board materials, such as fiberglass. A substrate heatsink will typically be secured to the opposite surface of the circuit board, so as to provide a conduction path from the circuit board to the environment.

To promote both electrical and thermal contact with the circuit component, the conductor is typically formed to include a conductor pad to which the heatsink of the circuit component is soldered. The conductor pad is generally an enlarged area of the conductor, which serves to reduce the electrical and thermal resistance between the circuit component and the conductor. Conventionally, a single mass of solder is deposited on the conductor pad such that the entire surface interface between the component's heatsink and the conductor pad is occupied by the solder. The integrity of the electrical and thermal contact between the circuit component and the conductor pad relies not only on the amount of solder used to secure the circuit component to the conductor pad, but also on the quality of the solder joint formed by the solder. More particularly, the strength of the solder joint is critical to ensure that the circuit component will remain secured to the conductor pad to maintain both electrical and thermal contact. In addition, the uniformity of the solder joint ensures a low thermal and electrical resistance between the component and the conductor pad.

The strength and uniformity of the solder joint can be influenced by many factors. For instance, as the surface area of the solder joint between the component and the conductor pad increases, the strength of the solder joint increases. An increased surface area also corresponds to a larger conduction path between the component and the conductor pad, resulting in a lower resistance to electrical and thermal conduction between the component and the conductor pad. Thus, optimally, the size and shape of the conductor pad would provide the same surface area as that of the component's heatsink, and the entire interface area between the heatsink and the conductor pad would be occupied with a continuous, uniform layer of solder compound.

In addition, the potential for forming voids within the solder joint generally increases as the size of the circuit component increases. Specifically, a larger surface area occupied by the circuit component on the conductor pad corresponds to a decreased ability for flux gases produced during the solder process to escape from beneath the circuit component. While prior art soldering methods have been able to minimize the formation of solder joint voids in the past, current technologies which incorporate very large surface mounted circuit components in hybrid integrated circuits have sometimes resulted in the formation of voids within the solder joint between such components. Consequently, such solder joints are more prone to failure due to numerous thermal cycles and vibration, both of which are prevalent in automotive applications.

Thus, it would be desirable to provide a method for enhancing the solderability of a large surface-mounted circuit component to a conductor pad formed on a substrate, by preventing or at least substantially avoiding the formation of voids within the solder joint which adheres the circuit component to the conductor pad, such that the strength and durability of the solder joint is optimized as well as the electrical and thermal contact between the circuit component and the conductor pad.

SUMMARY OF THE INVENTION

It is an object of this invention to provide a means for forming a solder joint between a large circuit component and a conductor pad of a hybrid integrated circuit, wherein the means enhances solderability of the component to the conductor pad and the strength of the solder joint by substantially preventing the formation of voids within the solder joint.

It is a further object of this invention that such a means include forming the conductor pad with a number of passages which provide an escape route from beneath the circuit component for flux gases formed during the soldering process.

It is still a further object of this invention that such a means include selectively depositing a solder compound on the conductor pad, so as to promote the flow of the solder compound between the circuit component and the conductor pad, as well as the escape of the flux gases during the soldering process.

In accordance with a preferred embodiment of this invention, these and other objects and advantages are accomplished as follows.

According to the present invention, there is provided a means for securing a large surface-mounted integrated circuit device to the surface of a hybrid integrated circuit board. In particular, this invention is directed to soldering such a device to the circuit board, wherein the device includes a thermally and electrically conductive heatsink by which the device is soldered to the circuit board. The means of this invention promotes the integrity of the solder joint, such that a more reliable electrical and thermal conduction path is formed between the device and the circuit board.

First, a conductor pad is formed on the circuit board so as to provide an electrical contact between the device and other components on the circuit board, and a conduction path from the device's heatsink to the circuit board. In particular, the conductor pad includes a number of individual platforms which are defined by a number of trenches formed in the conductor pad. The trenches provide numerous passages through which the solder and flux gases may flow during the soldering process. The platforms serve as sites onto which the solder compound can be selectively deposited in a manner that further enhances the soldering process, such that voids within the solder joint are substantially eliminated.

The conductor pad is preferably screen printed onto the surface of a ceramic circuit board so as to have the desired number of platforms and trenches. The pattern formed by the trenches is preferably selected to promote the flow of flux gases beneath the heatsink of the device during the soldering operation. In addition, the trench pattern preferably forms one or more passages to the perimeter of the conductor pad so as to provide several escape paths for the flux gases from beneath the heatsink. By providing a sufficient number of escape paths, there is less likelihood that voids will be formed within the solder joint as a result of flux gases being trapped within the solder. In addition, the trenches promote the flow of the solder beneath the heatsink so as to establish a uniform, high integrity solder joint. The individual platforms defined by the trenches provide ideal sites at which solder can be selectively deposited, so as to provide a number of sites from which the solder flows as it travels through the trenches.

The soldering method made possible by the novel conductor pad of this invention yields a stronger solder joint, such that likelihood of failure of the solder joint is significantly reduced. The method is particularly suited for use with large surface-mounted components whose sizable contact area with the conductor pad would normally inhibit the escape of flux gases from beneath the device during the soldering operation.

The soldering process includes forming the electrically-conductive conductor pad on a ceramic substrate such that the conductor pad has a substantially planar surface which is composed of a number of individual platforms for supporting the device. A trench is formed between at least two adjacent platforms, and more preferably, between each adjacent pair of platforms. Most preferably, each trench extends from the interior of the conductor pad and is contiguous with the perimeter of the conductor pad, such that a number of egress passages are formed from the interior to the perimeter of the conductor pad. Once the conductor pad has been defined, a solder compound and flux compound is deposited on the conductor pad, and a desired circuit device is placed on the conductor pad, such that the heatsink of the device contacts the solder compound.

The temperature of the solder compound is then increased such that the solder compound melts and flows through the trenches and between the heatsink and the conductor pad. In addition, the flux compound flows ahead of the solder compound so as to promote solderability by aiding the flow of the solder compound and preventing the formation of oxides on the metal surfaces being soldered. The flux and its associated gases eventually escape from beneath the heatsink by flowing through the egress passages formed by the trenches. The solder compound is then cooled so as to form a solder joint which bonds the heatsink to the conductor pad.

A particularly advantageous feature of this invention is that the integrity of the solder joint is enhanced because the trenches and egress passages permit the flux gases to readily escape during the soldering operation, so as to substantially prevent the formation of voids within the solder joint. As a result, the strength and uniformity of the solder joint between the heatsink and the conductor pad is significantly enhanced.

Such an effect yields a more durable and reliable contact between the heatsink and the conductor pad for both the conduction of electricity and the conduction of heat from the integrated circuit device to the conductor pad. As a result, the reliability of the circuit device, as well as the entire hybrid integrated circuit, is improved. The enhanced strength and uniformity of the solder joint is particularly desirable when used in an automotive environment, where electronic components are required to survive numerous repeated thermal cycles and road vibrations.

In addition, the advantages of this invention can be readily adopted by those skilled in the art by using conventional processes which add minimal cost to the price of the product in terms of processing time and complexity.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

A structure is provided for improving the integrity of a solder joint between a large surface-mounted integrated circuit component and a circuit board substrate. In particular, the strength of the solder joint is promoted by preventing the formation of voids in the solder joint during a reflow soldering process by which the component is secured to the circuit board. The preferred configuration of the structure of this invention permits the solder and flux compounds used in the reflow solder technique to readily flow beneath the component.

Figure 1:
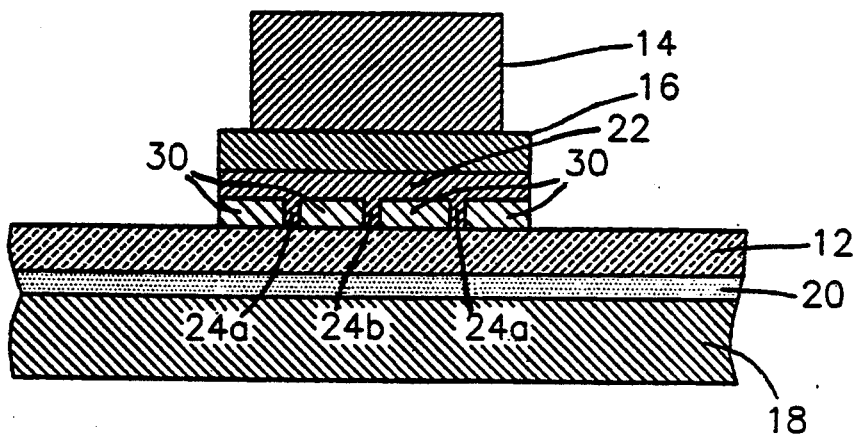
FIG. 1 shows in cross section a surface-mounted circuit component which is mounted to a conductor pad formed on a hybrid integrated circuit board.

FIG. 1 illustrates a large surface-mounted integrated circuit component 14 for which the method of this invention is intended. The component 14 is supported by a conductor pad 10, which is formed on a suitable substrate 12. As is conventional, the conductor pad 10 has a planar shape and is preferably formed from a palladium-silver alloy which forms an electrically conductive path on the surface of the substrate 12. The thickness of the conductor pad 10 may vary with the particular application, but most typically will be in the range of about 0.007 to about 0.02 millimeters. The conductor pad 10 will typically compose an enlarged surface portion of a printed conductor on the surface of the substrate 12, the size of the conductor pad 10 being commensurate with the size of the component 14 being supported and soldered to the conductor pad 10.

As is conventional for use in hybrid integrated circuits of the type which includes the component 14, the substrate 12 is preferably formed from a ceramic material, such as alumina. Alumina is widely used because it is a dielectric material, yet possesses acceptable thermal conductivity properties. As a result, an alumina substrate is capable of electrically insulating the devices mounted to its surface, yet is also capable of conducting heat away from the devices in order to maintain the operating temperatures of the devices at an acceptable level. As shown, a substrate heatsink 18 is adhered to the substrate 12 with a suitable thermally conductive adhesive 20, so as to conduct the heat from the substrate 12 to the environment. The substrate heatsink 18 may be formed from a conventional heatsink material, such as copper or aluminum.

As also seen in FIG. 1, the component 14 is generally a package which includes a heatsink 16 that is either integrally formed with the component package or otherwise integrally secured to the component package. The component 14 is secured to the conductor pad 10 with a suitable solder compound 22, such as a conventional 60% tin-40% lead (by weight) solder used with electronic equipment, although other suitable solders could well be used. This solder 22 has a melting temperature of about 200° C. to about 250° C., which is well below the melting temperatures of the other materials used to form the hybrid integrated circuit.

The preferred method for soldering the component 14 to the conductor pad 10 is a conventional reflow soldering technique. As is well known to those skilled in the art, this technique involves applying the solder 22 in the form of a screen printed paste which is sufficiently tacky to support the component 14 on the conductor pad 10. The entire substrate 12 is then heated until the solder 22 flows, so as to bond the component 14 both electrically and mechanically to the conductor pad 10. Typically, a flux will be used in conjunction with the solder 22 to promote the soldering process by aiding the flow of the solder 22 and preventing the formation of oxides on the metal surfaces being soldered. A suitable flux for the purposes of this invention is a rosin-type flux, though other flux compounds can be used.

Figure 2:
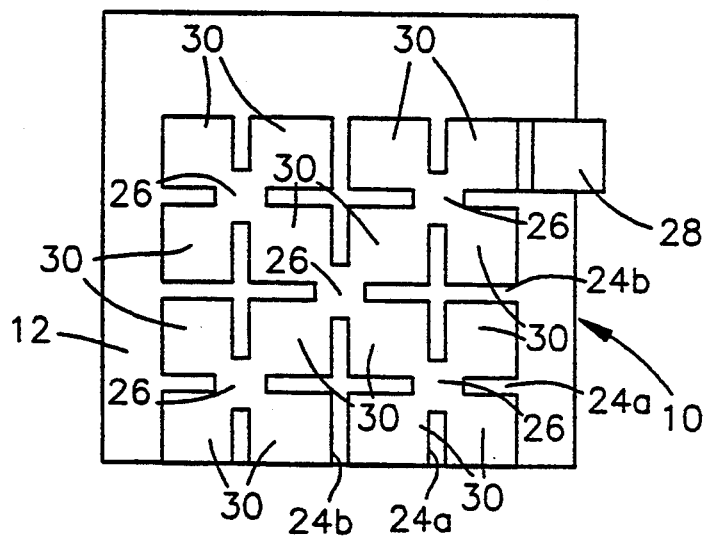
FIG. 2 shows a plan view of the conductor pad of FIG. 1 in accordance with a preferred embodiment of this invention.

Referring now to FIG. 2, a preferred configuration for the conductor pad 10 of this invention is shown. The conductor pad 10 is preferably composed of an array of platforms 30 which are defined by a number of trenches 24a and 24b. The trenches 24a and 24b preferably partition the conductor pad 10 such that the platforms 30 are approximately equally sized. As can be seen in FIG. 2, the platforms 30 may remain interconnected with bridges 26. Together, the array of platforms 30 and trenches 24a and 24b preferably define a relatively symmetrical pattern on the surface of the conductor pad 10. However, the pattern formed by the platforms 30 and trenches 24a and 24b can be greatly varied, such that the configuration of a conductor pad 10 formed in accordance with this invention is not to be limited to that illustrated in FIG. 2.

In effect, the platforms 30 constitute the conductor pad 10, and the bottoms of the trenches 24a and 24b consist of the substrate 12. Accordingly, the height of the platforms 30 corresponds to the thickness of the conductor pad 10 as formed on the substrate 12. The distance which the platforms 30 are spaced apart, corresponding to the width of the trenches 24a and 24b, may vary in accordance with the size of the component 14 and the amount of solder 22 required. Generally, a width of about 0.13 to about 0.38 millimeters appears to be suitable for a component whose size is as large as a couple of centimeters per side.

The platforms 30 are preferably formed using a screen printing technique of the type known in the art. Screen printing permits relatively accurate definition of the platforms 30 within a minimal amount of processing time. Generally, the screen printing process involves passing the conductor material through a single screen, such that the size and shapes of the platforms 30, as well as the width of the trenches 24a and 24b and the overall size of the conductor pad 10, are determined by the screen. The height of the platforms 30, and therefore the depth of the trenches 24a and 24b, is determined by the amount of material deposited onto the substrate 12 through the screen.

As can be seen in FIG. 2, the trenches 24a and 24b define a trench network which uniformly apportions the conductor pad 10. As shown, the trenches 24a extend into the interior of the conductor pad 10 from the perimeter of the conductor pad 10 a limited distance relative to the size of the conductor pad 10, while the trenches 24b extend further into the interior of the conductor pad 10, and then branch out to further divide the conductor pad 10. Accordingly, each of the trenches 24a and 24b provides a passage from the interior to the perimeter of the conductor pad 10.

Though the platforms 30 are shown as being roughly square in shape as a result of the generally rectilinear arrangement of the trenches 24a and 24b, the specific shape of the platforms 30 and the specific layout of the trenches 24a and 24b illustrated in Figure is not necessary to practice this invention. Generally, any network of trenches 24a and 24b which promote the flow of solder 22 and flux through the conductor pad 10 and enable the escape of flux gases during a soldering operation in the manner to be described below will fall within the scope of this invention.

Figure 3:
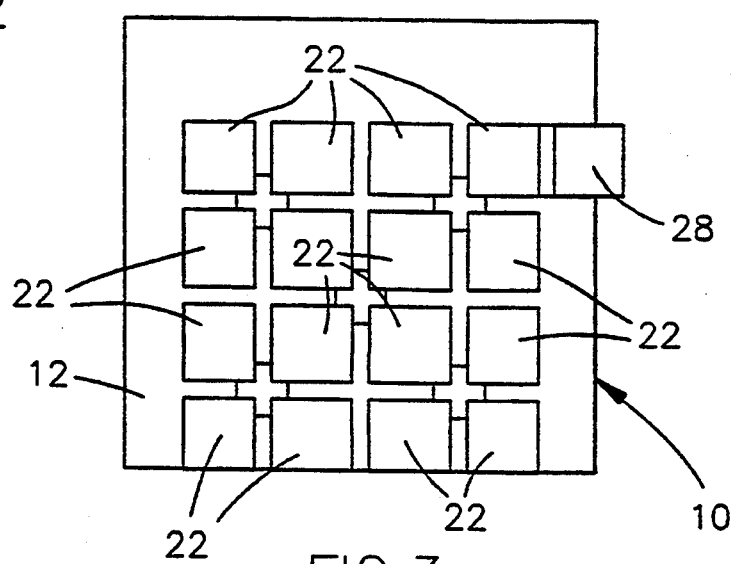
FIG. 3 is a plan view of the conductor pad of FIG. 2, wherein the preferred placement of a solder compound is shown in accordance with this invention.

As seen in FIG. 3, in contrast to conventional practices where a large single mass of solder is deposited onto a conductor pad, this invention preferably encompasses the selective deposition of predetermined quantities, or droplets, of solder 22 onto each of the platforms 30. The droplets of solder 22 provide a uniformly distributed base to which the component 14 can be supported prior to the soldering process. As noted before, the solder 22 is preferably deposited as a paste on the conductor pad 10 using a screen printing technique. As shown, the solder 22 is deposited in the approximate shape of a square to correspond to the shape of the platforms 30. However, as was noted with the shape of the platforms 30, the shape of the droplet of solder 22 can be easily varied using a screen printing technique, and is not to be interpreted as a limitation to the scope of this invention. The preferred thickness of an individual droplet of solder 22 will generally vary with the type of solder used and surface area which must be covered, and can be determined without undue experimentation.

As illustrated in FIG. 3, the droplets of solder 22 are preferably separated by the trenches 24a and 24b, with adjacent corners of the droplets facing each other across one of the bridges 26 formed between the terminal ends of adjacent trenches 24a and 24b. During the reflow soldering process, the solder 22 will tend to flow across the bridges 26 and fill the void there, while also flowing down into the trenches 24a and 24b until the entire surface of the conductor pad 10 is covered with a molten layer of solder 22 having a substantially uniform and planar upper surface which mates with and bonds to the heatsink 16 of the component 14. Importantly, as the solder 22 melts, the trenches 24a and 24b will provide passages through which the flux can flow ahead of the solder 22, such that solderability is promoted by permitting the gases produced by the flux to flow ahead of the solder 22 and eventually escape from beneath the component 14 through the trenches 24a and 24b to the perimeter 32 of the conductor pad 10.

To better illustrate the advantages of this invention, a preferred reflow soldering process is described below. As is conventional, the soldering process includes depositing a quantity of solder 22 onto the conductor pad 10, positioning the component 14 on the solder 22, heating the solder 22 sufficiently such that the solder 22 flows, and then cooling the solder 22 to form a permanent solder joint between the component 14 and the conductor pad 10. However, in light of the teachings of this invention as described above, the preferred soldering process begins with forming the conductor pad 10 on the substrate 12 using the above-described screen printing technique so as to have a preferred number of platforms 30 defined by the network of trenches 24a and 24b. The solder 22 and flux are then selectively deposited onto the individual platforms 30 using a screen printing technique so as to produce a pattern of droplets of solder 22 which will provide a stable and level base for the component 14. Other features on the substrate 12, such as an electrically conductive interconnect 28 shown in FIG. 3, may also be formed about this time.

The component 14 is then placed on the solder 22 such that its heatsink 16 contacts the solder 22. The temperature of the entire substrate 12 is then increased to a temperature above the melting temperature of the solder 22 but below the melting temperatures of the other constituents of the hybrid integrated circuit. As noted previously, a preferred soldering temperature for a 60/40 tin/lead solder compound is generally about 200° C. to about 250° C. Within this range, the solder 22 melts and flows across the bridges 26 and through the trenches 24a and 24b, while the flux flows ahead of the solder 22 and eventually escapes from beneath the heatsink 16 through the egress passages defined by the trenches 24a and 24b. The substrate 12 is then cooled sufficiently to resolidify the solder 22, so as to form a uniform, continuous, and strong solder joint which bonds the component 14 to the conductor pad 10. Thereafter, further conventional circuit board processing is commenced.

A series of tests were conducted to compare the strength of the solder joints formed by the method of this invention as compared to solder joints formed using a conventional, solid-surface conductor pad. Each group consisted of five samples which were formed using identical large surface-mounted components having copper heatsinks and molded plastic packages. The components were appropriately sized to mate with the conductor pads used for the test, each having roughly a 0.2 by 0.2 inch bonding surface.

The test essentially consisted of simultaneously soldering the components to their respective conductor pads using the solder and flux compounds described previously, so as to ensure nearly identical soldering conditions. Accordingly, the only difference between the test samples was that one group of samples, denoted Group A, utilized the conductor pad shown in FIG. 2 with the solder placement as shown in FIG. 3. The second group of samples, denoted Group B, utilized a conductor pad whose upper surface was uninterrupted, i.e., without the trenches 24a and 24b as taught by this invention.

The conductor pads were then similarly fixtured and, in turn, a bar was brought to bear against each of the components in a direction parallel to the surface of their respective conductor pads. The force imposed by the bar was gradually increased until either the solder joint failed by shearing or, alternatively, the component's package failed. Results of the test are as follows.

|  | Group A samples (pounds force) | Group B samples (pounds force) |
| --- | --- | --- |
|  | 147 | 146 |
|  | 163 | 153 |
|  | 147 | 144 |
|  | 176 | 142 |
|  | 163 | 139 |
| Average: | 159 lbs. force | 145 lbs. force |

From the above, it can be seen that an average improvement of almost 10 percent in joint strength was attained by employing the conductor pad 10 of this invention as compared to the use of a solid conductor pad in accordance with the prior art. Several of the components of Group A did not separate at the solder joint (at the heatsink 16 to conductor pad 10 interface), but failed as a result of the separation of the component's molded plastic package. Consequently, for these samples, the solder joint formed in accordance with this invention was stronger than the component itself.

In addition, inspection of the samples of Group A found substantially void-free solder joints, indicating that the trenches 24a and 24b had achieved their purpose of distributing the solder 22 and flux compound over the surface of the conductor pad 10, while also enabling the flux gases to escape from beneath the heatsinks 16. In contrast, the Group B samples were characterized by voids formed within the solder joint.

Accordingly, an advantage of using the conductor pad 10 of this invention is that the integrity of the solder joint, as evidenced by the strength and uniformity of the solder joint, is enhanced because the trenches and the egress passage serve to substantially prevent the formation of voids within the solder joint, by permitting the flux gases to readily escape during the soldering operation. Because the trenches 24a and 24b are preferably provided as a uniform network in the surface of the conductor pad 10, the solder joint 22 tends to be uniformly distributed between the heatsink 16 and the conductor pad 10, which further enhances the mechanical properties of the solder joint 22.

As a result, the use of the conductor pad 10 in accordance with this invention yields a more reliable electrical and thermal contact between the heatsink 16 and the conductor pad 10. In particular, the strength and uniformity of the solder joint 22 enhances its durability in terms of surviving the numerous thermal cycles and road vibrations experienced by electronic components used in the automotive industry. As a result, the reliability of the component 14 and the hybrid integrated circuit in which the component 14 is used is significantly improved. In addition, the advantages of this invention can be realized using conventional processes which add minimal cost to the price of the product in terms of processing time and complexity.

While our invention has been described in terms of a preferred embodiment, it is apparent that other forms could be adopted by one skilled in the art. For example, the pattern defined by the platforms 30 and trenches 24a and 24b could be modified, as well as the peripheral geometry of the conductor pad 10, different materials could be substituted for those suggested, and processing parameters could be altered. Accordingly, the scope of our invention is to be limited only by the following claims.

The embodiments of the invention in which an exclusive property or privilege is claimed are defined as follows:

1. A hybrid circuit assembly including a ceramic substrate, an electrically conductive pad formed on said substrate, and an integrated circuit package having an integral thermally conductive heatsink soldered to said pad, the improvement wherein: at least a portion of said pad intermediate said substrate and said heatsink comprises a plurality of platforms soldered to said heatsink and a plurality of trenches formed between adjacent platforms, at least one of the trenches being contiguous with an outer perimeter of the pad so as to form an egress passage for a flux compound used during soldering of said heatsink to said platforms.

2. The improvement of claim 1, wherein the plurality of platforms are interconnected along at least a portion of their respective perimeters.

3. The improvement of claim 1, wherein the plurality of platforms define an array of platforms.

4. The improvement of claim 1, wherein each of the trenches forms an egress passage to the outer perimeter of the pad.

5. The improvement of claim 1, wherein the plurality of platforms define a substantially symmetrical pattern on the ceramic substrate.

* * * * *